United States Patent

Park et al.

[11] Patent Number: 5,999,111
[45] Date of Patent: Dec. 7, 1999

[54] VARIABLE LENGTH ENCODING/DECODING APPARATUS USING RE-ASSOCIATION OF SYMBOL-CODEWORD FOR VARIABLE LENGTH CODE TABLE

[75] Inventors: Juha Park, Suwon; Byeungwoo Jeon, Sungnam; Jechang Jeong, Seoul, all of Rep. of Korea

[73] Assignee: Samsung Electronics Co., Ltd., Kyungki-do, Rep. of Korea

[21] Appl. No.: 08/563,018

[22] Filed: Nov. 27, 1995

[30] Foreign Application Priority Data

Nov. 26, 1994 [KR] Rep. of Korea ................. 94-31359

[51] Int. Cl.⁶ .................................. H03M 7/40
[52] U.S. Cl. ............................. 341/67; 341/51
[58] Field of Search ...................... 341/51, 63, 65, 341/67

[56] References Cited

U.S. PATENT DOCUMENTS

| | | | |
|---|---|---|---|
| 4,486,784 | 12/1984 | Abraham et al. | 341/51 |
| 4,700,175 | 10/1987 | Bledsoe | 341/65 |
| 5,086,439 | 2/1992 | Asai et al. | 341/65 |
| 5,235,623 | 8/1993 | Sugiyama et al. | 341/67 |
| 5,392,038 | 2/1995 | Bhandari et al. | 341/67 |

*Primary Examiner*—Michael Tokar
*Assistant Examiner*—Peguy JeanPierre
*Attorney, Agent, or Firm*—Sughrue, Mion, Zinn, Macpeak & Seas, PLLC

[57] ABSTRACT

A variable length encoding/decoding apparatus using symbol-codeword re-association of a variable length code table includes a re-associator for storing symbol-address assignment information, address-codeword assignment information and address-counter-value assignment information, altering the symbol-address assignment information and the address-counter value assignment information according to the varied counter value due to the symbol identifying and outputting a variable length code table in which a symbol-codeword is re-associated to the encoder/decoder apparatus, and a controller for producing the initialized counter values based on probabilities of symbol occurrences belonging to the pre-defined variable length code table and the information stored in the re-associator based on the pre-defined updating unit, and storing the symbol-codeword re-associated variable length code table every predetermined updating unit in the encoder/decoder. A data compression efficiency can be improved even though global statistics corresponding to the pre-defined variable length code table and local statistics of the symbols/codewords which are actually variable-length-encoded/decoded do not match each other. Since it is not necessary to transmit the symbol-codeword re-association information at the encoding end to a decoding end, threre is no additional data to be transmitted by employing the present invention.

34 Claims, 5 Drawing Sheets

TC/TU

| $M_1$ | $P_1$ |
| $M_2$ | $P_2$ |
| ⋮ | ⋮ |
| $M_{K-1}$ | $P_{K-1}$ |
| $M_K$ | $P_K$ |
| ⋮ | ⋮ |
| $M_N$ | $P_N$ |

COUNTER VALUE    invTU

| $C_1[P_1]$ | $M_1$ |
| $C_2[P_2]$ | $M_2$ |
| ⋮ | ⋮ |
| $C_{K-1}[P_{K-1}]$ | $M_{K-1}$ |
| $C_K[P_K]$ | $M_K$ |
| ⋮ | ⋮ |
| $C_N[P_N]$ | $M_N$ |

TW

| $P_1$ | $CW_1$ |
| $P_2$ | $CW_2$ |
| ⋮ | ⋮ |
| $P_{K-1}$ | $CW_{K-1}$ |
| $P_K$ | $CW_K$ |
| ⋮ | ⋮ |
| $P_N$ | $CW_N$ |

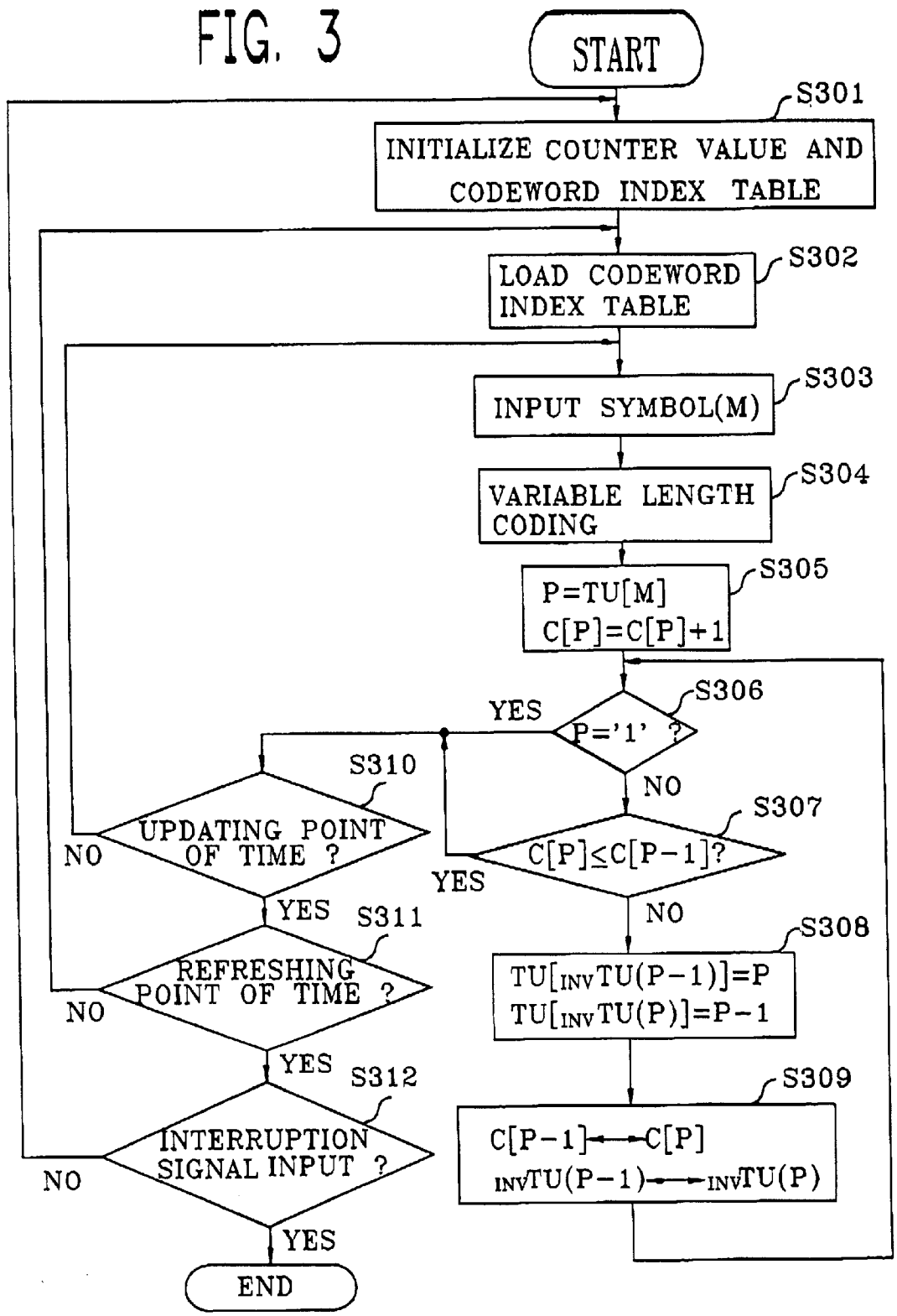

VARIABLE LENGTH ENCODING/ DECODING APPARATUS USING RE-ASSOCIATION OF SYMBOL-CODEWORD FOR VARIABLE LENGTH CODE TABLE

BACKGROUND OF THE INVENTION

1. Field of the Invention

The present invention relates to a variable length encoding/decoding apparatus using re-association of a symbol-codeword for a pre-defined code table.

2. Description of Related Art

Generally, data compression/decompression systems use quantization and orthogonal transform to reduce redundancy in the data especially for image data. A variable length coding (VLC) method which belongs to a lossless encoding method is often employed additionally to further compress data.

In block-based image data compression, a variable length coding method uses a zigzag scan to produce a "run" value and a "level" value from transform coefficients which are obtained by orthogonal transform. The variable length coding method uses a Huffman code table to change a symbol having a run value and a level value into a codeword. Here, the run value represents the number of successive zeros before a non-zero value and the level value is an absolute value of a non-zero coefficient succeeding the successive zeros. In the case where a symbol is represented as a pair of run and level values, if a run value or a level value is large, a frequency of occurrence of the symbol becomes statistically very low. Thus, the Huffman coding method which is generally used in the VLC method uses a codeword having a relatively short length for a symbol having a higher frequency of occurrence on the basis of probabilities of symbol occurrences. The Huffman code table shows that a relatively shorter codeword is allocated to a symbol having a higher frequency of occurrence, and a relatively longer codeword is allocated to a symbol having a lower frequency of occurrence. A pre-defined Huffman code table is generally used depending on the overhead and delay time. FIG. 1 shows a conventional variable length coding apparatus that uses the Huffman code table which is designed in the above-described manner.

A code table unit 15 of FIG. 1 stores the Huffman code table which is designed by the above-described method. A variable length encoder 11 finds a codeword corresponding to an input symbol from the Huffman code table stored in the code table unit 15 and outputs the corresponding codeword. Typically, the input symbol is used as an address at which the corresponding codeword is stored. Thus, if a variable length decoder (not shown) uses the same Huffman code table as that of the code table unit 15, the variable length decoder can retrieve the symbol from the transmitted codeword.

However, when a relationship between symbols and codewords as defined in the pre-defined Huffman code table does not reflect properly the actual probabilities of symbol occurrences as in the case where a symbol corresponding to a lengthy codeword has a higher frequency of occurrence, data compression efficiency through the VLC method can be significantly limited.

Prior art which attempts to solve the above problem is disclosed in U.S. Pat. No. 5,086,439 to Asai et al., entitled "Encoding/decoding system utilizing local properties" which was issued on Feb. 4, 1992. The prior art encoding/decoding system codes input digital signals sequentially on the basis of frequencies of occurrence of the input digital signals, and decodes the encoded signals sequentially, to thereby improve encoding efficiency. A sequential list of the encoding system receives and stores encoded data, outputs a list address in which the received encoded data are stored and moves the stored encoded data to a predetermined location every time encoding is performed, so as to update the first sequential list. A variable length encoder performs variable length coding on the basis of how frequently list addresses in the sequential list are used such that a shorter codeword is allocated to a more frequently used list address and a longer codeword is allocated to a less frequently used list address. Thus, an average code length can be shortened and encoding efficiency can be improved.

SUMMARY OF THE INVENTION

Therefore, to solve the above problems, it is an object of the present invention to provide a variable length encoding apparatus using a variable length code table in which a symbol-codeword is re-associated according to a new method on the basis of local symbol statistics.

It is another object of the present invention to provide a variable length decoding apparatus for variable-length-decoding a codeword generated by the above variable length encoding apparatus.

Yet another object of the invention is to provide a variable length encoding method in which a symbol-codeword is re-associated on the basis of local symbol statistics.

A still further object of the invention is to provide a variable length decoding method for a codeword generated by the above variable length encoding method.

To accomplish the above object of the present invention, there is provided a variable length encoding apparatus comprising:

control means for producing symbol-address assignment information and address-counter value assignment information based on a pre-defined variable length code table, and generating a load control signal for each predetermined updating unit; encoding means for receiving and storing symbol-address assignment information synchronized with the load control signal, and outputting respective codewords corresponding to respective input symbols using stored address-codeword assignment information; and means for storing the symbol-address assignment information and the address-counter value assignment information produced by the control means, varying the symbol-address assignment information and the address-counter value assignment information according to the same symbol as input to the encoding means, and outputting a re-associated symbol-codeword assignment on the basis of the varied results to the encoding means.

To accomplish a further object of the present invention described above, there is provided a variable length decoding apparatus for variable-length-decoding a codeword generated by a variable length encoding apparatus which re-associates a symbol-codeword relationship of a variable length code table whenever a symbol is variable length-encoded, and replaces the variable length code table used for variable-length-encoding the symbol every predetermined updating unit by a symbol-codeword re-associated variable length code table, the variable length decoding apparatus comprising:

control means for producing symbol-address assignment information and address-counter value assignment information based on a pre-defined variable length code table, and generating a load control signal at every predetermined updating unit; decoding means for receiving and storing the symbol-address assignment information synchronized with the load control signal, and outputting a respective symbol corresponding to a respective input codeword using the stored symbol-address assignment information; and re-association means for storing the symbol-address assignment information and the address-counter assignment information produced by the control means, varying the symbol-address assignment information and the address-counter value assignment information according to the same symbol as output from the decoding means, and outputting a re-associated symbol-codeword assignment on the basis of the varied results to the decoding means.

BRIEF DESCRIPTION OF THE DRAWINGS

The preferred embodiments are described with reference to the drawings wherein:

FIG. 1 is a block diagram of a conventional variable length encoding apparatus.

FIG. 3 is a flow-chart diagram for explaining a method for re-associating a symbol-codeword in a code table of the FIG. 2 apparatus.

FIGS. 4A through 4D are views for explaining re-association of the codeword with respect to the symbol using counter values of the symbols, in which FIGS. 4A, 4B, 4C and 4D represent a codeword index table, a counter and inverse codeword index table, a code table, and address-symbol table, respectively.

DETAILED DESCRIPTION OF THE PREFERRED EMBODIMENT

A preferred embodiment of the present invention will be described below in more detail with reference to the accompanying drawings.

Figures 1, 4A, 4B, 4C:
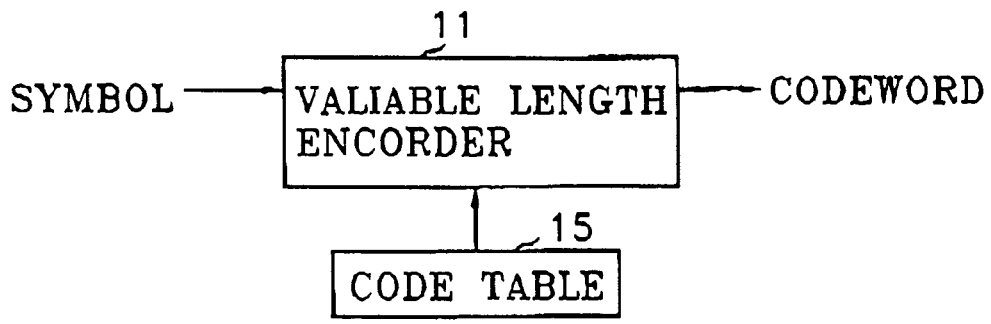
Figure 2:
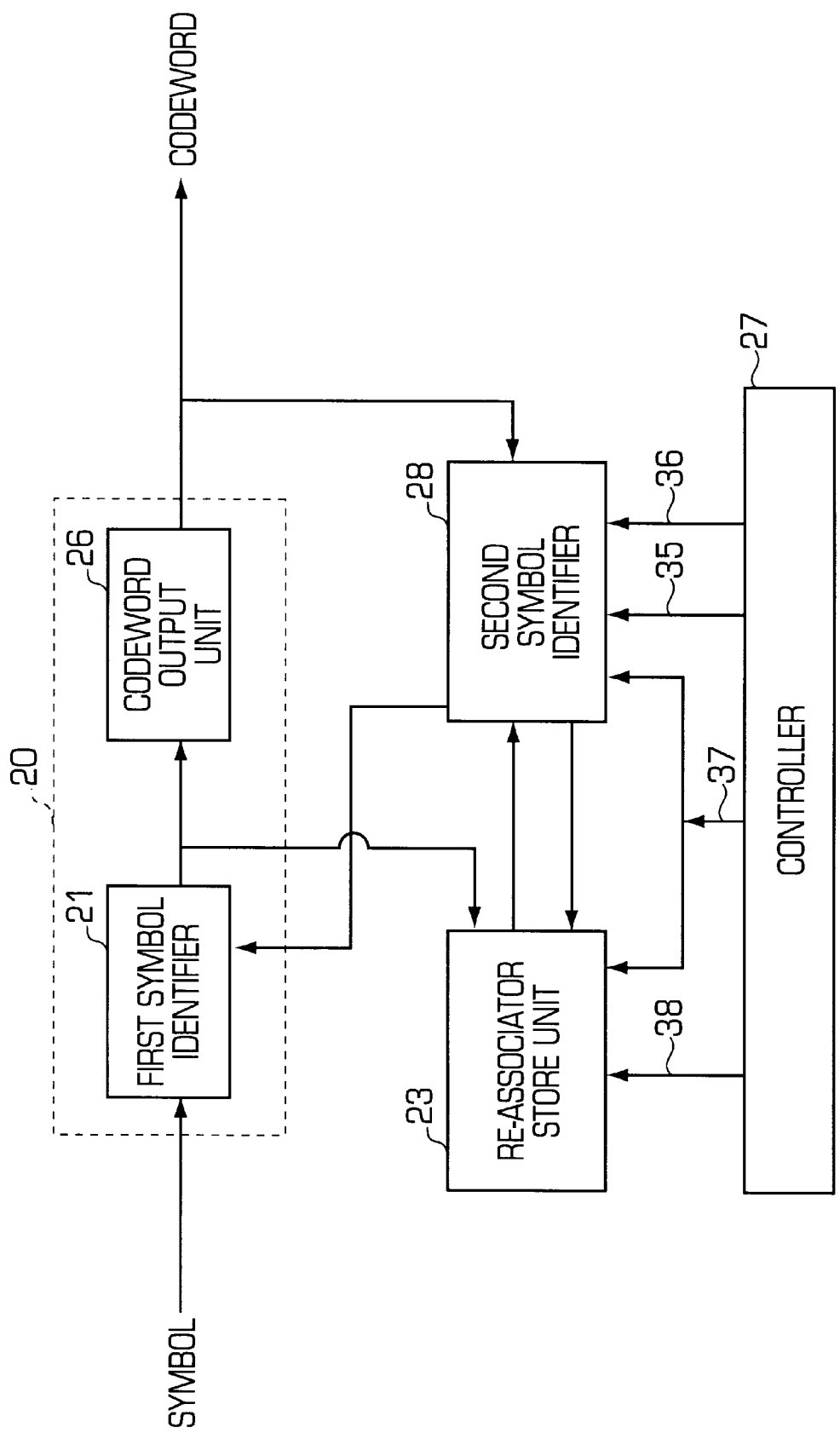
FIG. 2 is a block diagram of a variable length encoding apparatus according to a preferred embodiment of the present invention.

FIG. 2 is a block diagram of a variable length encoding apparatus according to a preferred embodiment of the present invention. In FIG. 2, a controller 27 generates initial address-counter assignment information 38, an initialization signal 37, a load signal LOAD 35 and initial symbol-address assignment information 36. The controller 27 generates the initial address-counter assignment information. The initial address-counter assignment information is supplied to a re-associator store unit 23. The controller 27 also generates initial symbol-address assignment information. A second symbol identifier 28 receives the initial symbol-address assignment information when the initialization signal 37 is activated. The initial symbol-address assignment information provides initial values of "codeword index tables for updating TU" in FIG. 4A. Also, the re-associator store unit 23 initializes a counter and an inverse codeword index table invTU in FIG. 4B based on the initial address-counter assignment information. The counter and inverse codeword index table is stored in the re-associator store unit 23, and the initial codeword index table is provided to a first symbol identifier 21 according to the load signal LOAD of the controller 27. The first symbol identifier 21 identifies the input symbol and outputs an address corresponding to the input symbol to a codeword output unit 26 which reads and outputs a codeword at the specified address of a stored pre-defined Huffman code table. The re-associator store unit 23 updates the codeword index table TU, counter and inverse codeword index table invTU on the basis of the identified address of the input symbol from the second symbol identifier 28. The updating information of codeword index table TU by the re-associator 23 is provided to the second symbol identifier 28 to reflect on the codeword index table for updating TU. The update table is denoted by TC. The codeword output unit 26 outputs a codeword corresponding to an input symbol based on the codeword index table for VLC encoding TC and the stored codeword table.

FIG. 4C shows the stored pre-defined variable length code table TW in the variable length encoder 20.

An operation of the FIG. 2 apparatus having the above-described structure will be described below with reference to FIG. 3 and FIGS. 4A through 4C.

When the FIG. 2 apparatus operates for the first time, the controller 27 generates an initialization signal 37, and then generates initial address-counter assignment information based on a sensitivity factor α and the pre-defined variable length code table, The step of initial address-counter assignment information applied to the re-associator store unit 23 corresponds to the step 301 of FIG. 3. In step 301, the controller 27 calculates an initial counter value $C_{INIT}[i]$, I=1, ..., N, with respect to each of N symbols belonging to a pre-defined variable length code table, using the following equation (1) (N is the total number of distinct symbols).

$$C_{INIT}[i] = \frac{\text{The average number of bits within a refreshing unit}}{\alpha \cdot 2^{(\text{a length of codeword corresponding to } i\text{-th symbol})}} \quad (1)$$

The refreshing unit is a time period at which the re-association unit is re-initialized. This is to limit propagation of errors in dynamic codeword re-association. A refreshing unit is typically a slice period in MPEG-2 application. That is, at each start of a slice, the initialization process is activated.

The sensitivity factor α represents how much the symbol-codeword re-association is sensitive to a distribution of the currently variable length-encoded symbols. If an initial counter value is calculated using equation (1), the distribution of the symbol used in the designing of the pre-defined variable length code table can be reflected in the symbol-codeword re-association. The controller 27 outputs the initial counter values as part of the initial address-counter value assignment information representing the relationship between the calculated initial counter values and symbols to the re-associator store unit 23. The controller 27 also generates the initial symbol-address assignment information and outputs such information to the second symbol identifier 28. The second symbol idenfifier 28 and the re-associator store unit 23 store the information supplied from the controller 27 in the form of the tables shown in FIGS. 4A and 4B, respectively. Particularly, the re-associator store unit 23 stores the initial counter values as counter values of corresponding addresses based on the initial symbol-address assignment information and address-counter value assignment information. The counter values $C_1[P_1]$, $C_2[P_2]$, ..., $C_N[P_N]$ and the address values $P_1, P_2, ..., P_N$ shown in FIG. 4B are arranged in decreasing order of counter values. That is, among the symbols on the pre-defined variable length code table, a symbol $M_1$ having the highest probability of occurrence has the largest counter value $C_1[P_1]$ while a symbol $M_N$ having the lowest probability of occurrence has the smallest counter value $C_N[P_N]$. With respect to the address values corresponding to the symbols, the smallest address value $P_1$ corresponds to the largest counter value $C_1[P_1]$ and the largest address value $P_N$ corresponds to the smallest counter value $C_N[P_N]$. The codeword table TW of FIG. 4C which represents a stored pre-defined variable-length code table is arranged in such a way that the shorter length codeword is located on the upper side, namely the former corresponds to the relatively small address value. In one embodiment of the present invention, the address values are constructed so that the smallest address value $P_1$ is designated as "1" and the rest of the address values increases by "1" from the smallest address value.

If the first symbol identifier 21 and the re-associator store unit 23 are initialized in step 301, the apparatus repeatedly performs a routine composed of steps 302 through 311 for every predetermined updating unit. In step 302, the second symbol identifier 28 outputs the symbol-codeword re-associated variable length code table TU to the first symbol identifier 21 upon receiving the load signal LOAD generated by the controller 27. When step 302 is performed for the first time, the second symbol identifier 28 outputs the initial codeword index table to the first symbol identifier 21. On the other hand, reaching an updating point of time and repeatedly performing step 302, the second symbol identifier 28 outputs only the updated codeword index table TU to the first symbol identifier 21. According to the loading signal LOAD supplied from the controller 27, the first symbol identifier 21 stores the codeword index table TU supplied from the second symbol identifier 28 as codeword index table TC to be used for variable length coding. In step 303, where a symbol is applied to the FIG. 2 apparatus, the first symbol identifier 21 determines an address corresponding to the input symbol by referring to the codeword index table TC and outputs the address to the codeword output unit 26. The codeword output unit 26 reads out the codeword corresponding to identified input symbol M from the pre-defined table and outputs the read codeword in step 304. The present invention is not limited in the structures and operations of variable length encoder 20 according to the particular embodiment of the present invention. It is apparent to one skilled in the art that a number of modifications and variations such as a structure of the variable length encoder 20.

In step 305, the second symbol identifier 28 uses the codeword index table TU for updating to determine an address value P corresponding to the input symbol M. This address value P is input to the re-associator store unit 23 which increases by one the corresponding counter value C[P] [which is designated by determined address value P]. Then, the re-associator store unit 23 judges whether the determined address value P is "1," which is the address value corresponding to the largest counter value in step 306. If address value P is not "1," the re-associator store unit 23 compares increased counter value C[P]+1 corresponding to address value P with counter value C[P−1] corresponding to address value P−1 in step 307. If C[P]+1 is larger than C[P−1], the re-associator store unit 23 uses operators $TU[_{INV}TU[P-1]]$ and $TU[_{INV}TU[P]]$ to replace the address value P−1 on the codeword index table TU in the second symbol identifier 28 by P and P by P−1, respectively in step 308. The replacing information is conveyed to the second symbol identifier 28. This relates to exchanging the codeword association of symbols corresponding to address P and P−1. The re-associator store unit 23 performs step 309 to match the address values altered in step 308 with the counter values and inverse codeword index values corresponding to the altered address values. That is, in step 309, the re-associator store unit 23 alters increased counter value C[P]+1 corresponding to address value P into counter value C[P−1] corresponding to address value P-i, and counter value C[P−1] corresponding to address value P−1 into increased counter value C[P]+1 corresponding to address value P, respectively. The re-associator store unit 23 also alters the inverse codeword index value $_{INV}TU[P-1]$ corresponding to address value P into $_{INV}TU[P]$ and inverse codeword index value $_{INV}TU[P]$ corresponding to address value P−1 into $_{INV}TU[P-1]$, respectively.

For more understanding of steps 308 and 309, a case where an address value corresponding to the address of an input symbol is $P_K$ and the increased counter value $C_K[P_K]+1$ corresponding to address value $P_K$ is larger than $C_{K-1}[P_{K-1}]$ will be described below with reference to FIGS. 4A and 4B. As a result of step 308, the address value on codeword index table TU of FIG. 4A corresponding to symbol $M_K$ in step 308 is changed from $P_K$ into $P_{K-1}$ and the address value corresponding to symbol $M_{K-1}$ is changed from $P_{K-1}$ into $P_K$. In step 309, counter value $C_{K-1}[P_{K-1}]$ and inverse codeword index value $M_{K-1}$ corresponding to address value $P_{K-1}$ of FIG. 4B are changed into $C_K[P_K]+1$ and $M_K$, respectively. Also, counter value $C_K[P_K]+1$ and inverse codeword index value $M_K$ corresponding to address value $P_K$ are changed into $C_{K-1}[P'_{K-1}]$ and $M_{K-1}$, respectively. A routine composed of steps 306 through 309 repetitively performs the re-association of the codeword index table, the counter value, and inverse codeword index table as necessary based on the counter value corresponding to the address value of the identified symbol when the address value corresponding to the identified symbol is not "1."

Next, steps 310 through 312 are performed by the controller 27. The controller 27 determines an updating point of time and a refreshing point of time based on a data structure used in the FIG. 2 apparatus. To prevent the effect of errors on the dynamic codeword assignment, the present invention has a capability of re-initializing the dynamic assignment on a periodic basis. For example, when the apparatus uses a data structure similar to the MPEG-2 standard, the refreshing unit can be defined as a slice. Furthermore, the present invention defines "updating unit" while a constant symbol-codeword assignment is maintained for variable length encoding. Under the data structure similar to MPEG-2, one preferred updating unit may be a macroblock unit The updating unit can prevent this system from being much more sensitive to local statistics without more improvement. If it is judged that it does not reach an updating point of time in step 310, the controller 27 does not generate a load signal LOAD. In this case, the first symbol identifier 21 maintains the stored codeword index table TC and thereafter the codeword output unit 26 performs the steps following step 303.

Meanwhile, if it is judged that the updating point of time has been reached in step 310, the controller 27 performs step 311 which judges whether the refreshing point of time has been reached. If it is judged that the refreshing point of time has not been reached in step 311, the controller 27 generates a load signal LOAD to output the generated load signal to the second symbol identifier 28. At this time, the re-associator symbol-address assignment information applied from the second symbol identifier 28 is stored in the first symbol identifier 21. Thereafter, the codeword output unit 26 performs a variable-length-encoding operation with respect to the codeword corresponding to the input symbol based on the newly re-associated symbol-codeword information. When the refreshing point of time has been reached in step 311, the controller 27 judges whether an operation end signal is applied thereto in step 312. If the operation end signal is not applied, the controller 27 generates the initialization signal, the sensitivity factor α and initial assignment information, respectively. Thereafter, the FIG. 2 apparatus performs again the steps starting from step 301.

In connection with the judgment of the above-described updating point of time, it is possible to have a number of modifications such as an example that the re-associator store unit 23 judges an updating point of time based on the number of the symbols applied from the external source or the number of input times of the identified symbols applied from the first symbol identifier 21, or the second symbol identifier 28.

Figure 5:
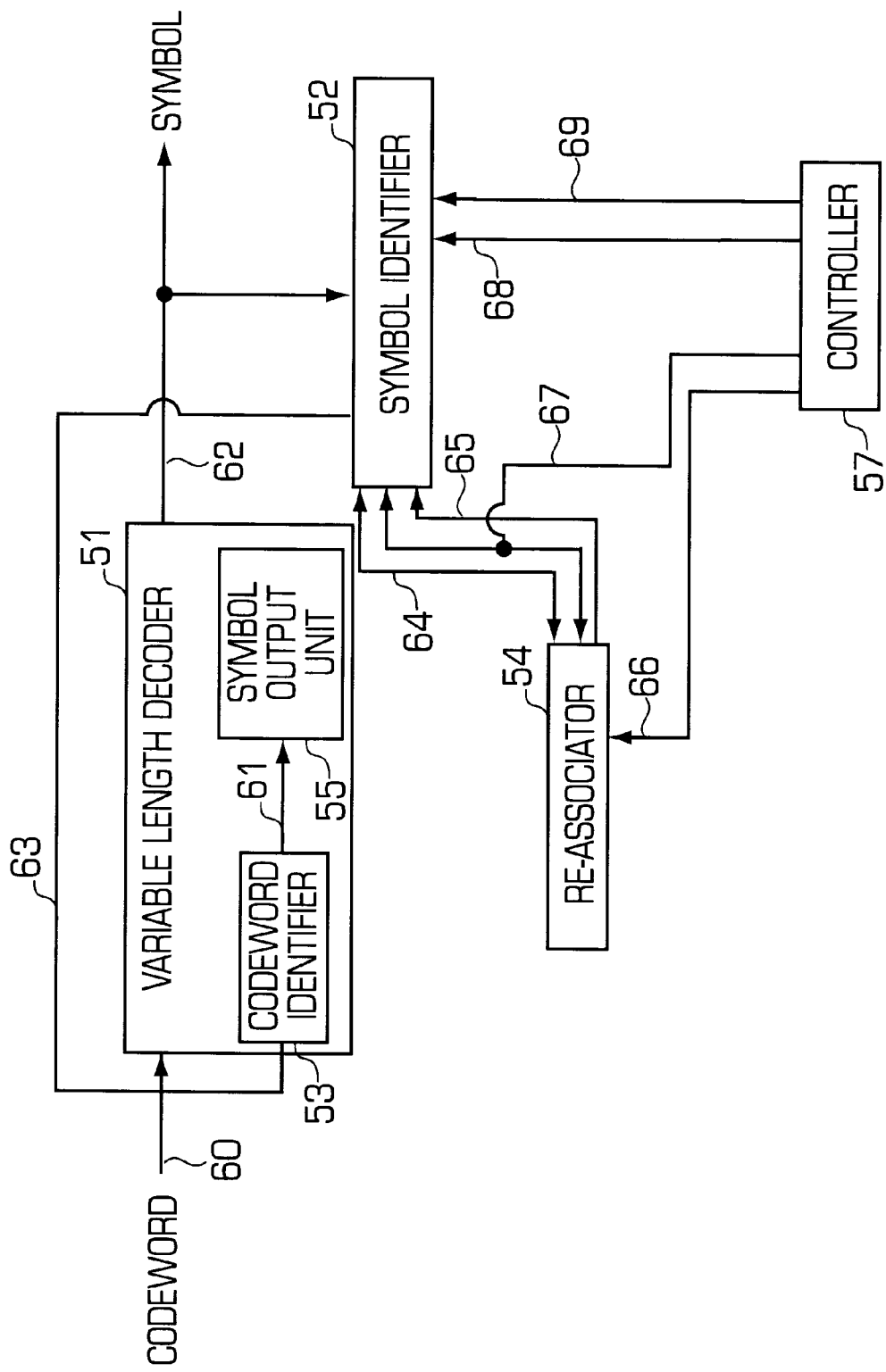
FIG. 5 is a block diagram of a variable length decoding apparatus according to a preferred embodiment of the present invention.

FIG. 5 is a block diagram of a variable length decoding apparatus corresponding to the apparatus of FIG. 2. The FIG. 5 apparatus re-associates a symbol index with respect to the input codewords, and performs an inverse process of the codeword index re-association which is described with reference to FIGS. 2, 3 and 4A through 4C. The structure and operation of the FIG. 5 apparatus will be described below.

If the FIG. 5 apparatus starts to operate, the controller 57 generates an initialization signal 67 to initialize the re-associator 54 and the symbol identifier 52. The controller 57 supplies the initial address-counter assignment information to the re-associator 54 based on a sensitivity factor α and on the same pre-defined variable length code table as that used in FIG. 2. Similar to the controller 27 in FIG. 2, the controller 57 calculates an initial counter value $C_{INIT}[i]$ with respect to each of the N symbols belonging to the pre-defined variable length code table based on the above equation (1). The controller 57 outputs the symbol-initial-counter-values 66 to the re-associator 54. The controller 57 also generates the initial symbol-address assignment information on the basis of the pre-defined code table and supplies the generated information to the symbol identifier 52. The re-associator 54 stores the initial counter values applied from the controller 57 in the form of the tables shown in FIG. 4B. The symbol identifier outputs the re-associated symbol address assignment information to the codeword identifier 53 when load signal 68 is activated by the controller 57.

Figure 4D:
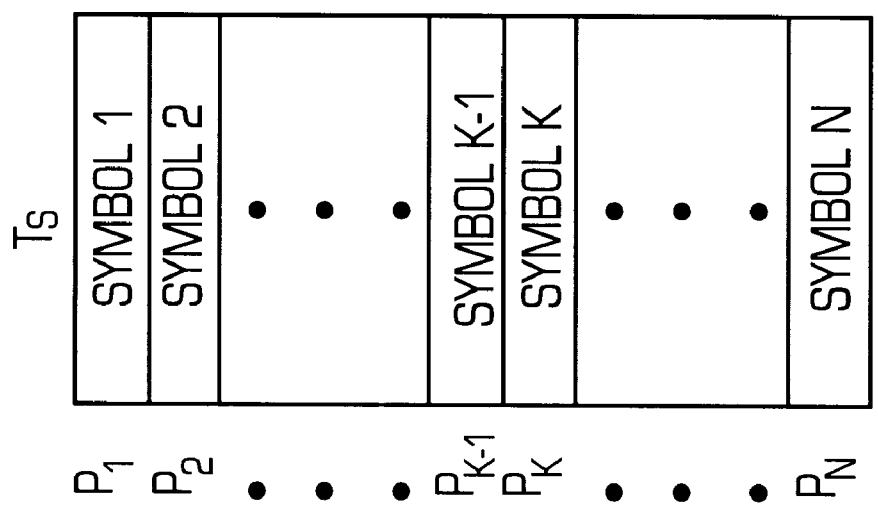

When the load signal 68 is activated by the controller 57, the symbol identifier outputs to the codeword identifier the re-associated symbol-address assignment information TU in FIG. 4A which the codeword identifier 53 stores as TC in FIG. 4A. When a codeword C is input, the codeword identifier 53 identifies and outputs an address P(=61) at which a corresponding symbol is located at the pre-defined variable-length code table for decoding. The variable length decoder 51 stores the pre-defined code table. It also has a symbol table TS in FIG. 4D which stores corresponding symbols in a table format at location specified by codewords. The symbol output unit 55 outputs a symbol corresponding to an address 61.

After initialization, when the codewords produced by the variable-length-encoding operation are input to the apparatus of FIG. 5, the codeword identifier 53 identifies and outputs an address of a symbol, and the symbol output 55 outputs a symbol being the decoded result. The symbol identifier 52 identifies the symbol output from the variable length decoder 51, increases the counter value corresponding to the symbol, and updates the symbol-counter assignment and invTU as the second symbol identifier 28 in FIG. 2. Re-associator 54 performs the same operation as that of re-associator 23 of FIG. 2 and updates the codeword index table, and the counter and inverse codeword index table. The controller 57 determines an updating point of time and a refreshing point of time based on the data structure used in the FIG. 5 apparatus. In an updating point of time, the controller 57 applies load signal LOAD to the symbol identifier 52 at this time. The variable length decoder 51 performs a variable-length-decoding operation of an input codeword based on the newly associated variable length code table information. Controller 57 performs the same operation of the updating point of time and the refreshing point of time as those of controller 27. Thus, the detailed descriptions thereof will be omitted.

The above-described embodiment of the present invention is designed for a case using single pre-defined variable length code table. However, a modified embodiment such as a case using a plurality of pre-defined variable length code tables is also possible by straightforwardly extending the technical boundary of the present invention.

As described above, the apparatus of the present invention can improve data compression efficiency, even though global statistics corresponding to the pre-defined variable length code table and local statistics of the symbols/codewords which are actually variable-length-encoded/decoded do not match with each other. Also, when symbol-codeword re-association is performed on the basis of a single pre-defined variable length code table, since it is not necessary to transmit the symbol-codeword re-association information at the encoding end to a decoding end, there is no additional data to be transmitted by employing the present invention.

While only certain embodiments of the invention have been specifically described herein, it will apparent that numerous modifications may be made thereto without departing from the spirit and scope of the invention.

What is claimed is:

1. A variable length encoding apparatus comprising:
   control means for producing symbol-address assignment information and address-counter value assignment information based on a pre-defined variable length code table, and for generating a load control signal at each predetermined updating data unit;
   encoding means for receiving and storing said symbol-address assignment information in synchronism with the load control signal, and for outputting codewords respectively corresponding to input symbols using said symbol-address assignment information stored by the encoding means to access the pre-defined variable length code table; and
   means for storing the symbol-address assignment information and the address-counter value assignment information produced by said control means, for varying the symbol-address assignment information and the address-counter value assignment information according to a symbol received by said encoding means, and for outputting a symbol-codeword re-associated variable length code table, in which a symbol-codeword assignment in the pre-defined variable length code table is re-associated in accordance with results from varying the symbol-address assignment information and the address-counter value assignment information, to said encoding means.

2. The variable length encoding apparatus according to claim 1, wherein the control means is configured to generate the load control signal at each said predetermined updating data unit which comprises a macroblock as defined in a data structure of the MPEG-2 standard.

3. The variable length encoding apparatus according to claim 1, wherein said control means is configured to produce the symbol-address assignment information and the address-counter value assignment information, using initial counter values sorted in a predetermined sorting order arranged on the basis of probabilities of symbol occurrences as defined in the pre-defined variable length code table.

4. The variable length encoding apparatus according to claim 3, wherein the predetermined sorting order includes assigning symbol having the highest probability of occurrence the largest counter value.

5. The variable length encoding apparatus according to claim 1, wherein said control means comprises:

a controller for generating the load control signal based on a designated data structure;

a re-associator store unit for producing respective counter values corresponding to each symbol in the pre-defined variable length code table, based on the probabilities of symbol occurrences, and for generating the address-counter value assignment information representing a corresponding relationship between the counter values and the symbols; and a second symbol identifier for generating the symbol-address assignment information based on the pre-defined variable length code table.

6. The variable length encoding apparatus according to claim 1, wherein said control means produces updated symbol-address assignment information and updated address-counter value assignment information at every pre-determined refreshing data unit, based on the pre-defined variable length code table.

7. The variable length encoding apparatus according to claim 6, wherein the predetermined refreshing unit is a slice unit as defined in data structure of the MPEG-2 standard.

8. The variable length encoding apparatus according to claim 6, wherein said control means calculates an initial counter value C(M) corresponding to each symbol M belonging to said pre-defined variable length code table based on the following equation:

$$C(M) = \frac{\text{The average number of bits within a refreshing unit}}{\alpha \cdot 2^{(\text{a length of codeword corresponding to } i\text{-th symbol})}}$$

wherein α represents a sensitivity factor representing a response level of symbol-codeword re-association to a distribution of the variable-length-encoded symbols.

9. The variable length encoding apparatus according to claim 1, wherein said means is configured to sort counter values in a predetermined sorting order based on probabilities of symbol occurrences as defined in the pre-defined variable length code table whenever a symbol is received by the variable length encoding apparatus, and wherein said means is further arranged to vary the symbol-address assignment information according to the sorted counter values, and to alter the address-counter value assignment information according to varied symbol-address assignment information.

10. The variable length encoding apparatus according to claim 1, wherein said control means comprises a first symbol identifier for identifying an input symbol according to said symbol-address assignment information.

11. A variable length decoding apparatus for variable-length-decoding a codeword generated by a variable length encoding apparatus which re-associates a symbol-codeword relationship of a variable length code table whenever a symbol is variable-length-encoded, and replaces the variable length code table used for variable-length-encoding the symbol at every predetermined updating data unit by a symbol-codeword re-associated variable length code table, said variable length decoding apparatus comprising:

control means for producing symbol-address assignment information and address-counter value assignment information based on a pre-defined variable length code table, and for generating a load control signal at every predetermined updating data unit;

decoding means for receiving and storing said symbol-address assignment information in synchronism with the load control signal, and for outputting symbols respectively corresponding to input codewords using said symbol-address assignment information to access the predefined variable length code table; and means for storing the symbol-address assignment information and the address-counter value assignment information produced by said control means, for varying the symbol-address assignment information and the address-counter value assignment information according to a symbol output from said decoding means, and for outputting a symbol-codeword re-associated variable length code table, in which a symbol-codeword assignment in the pre-defined variable length code table is re-associated on the basis of the results from varying the symbol-address assignment information and the address-counter value assignment information, to said decoding means.

12. The variable length decoding apparatus according to claim 11, wherein the control means is configured to generate the load control signal at each said predetermined updating data unit which comprises a macroblock as defined in the data structure of the MPEG-2 standard.

13. The variable length decoding apparatus according to claim 11, wherein said control means is configured to produce the symbol-address assignment information and the address-counter assignment information, using initial counter values sorted in a predetermined sorting order arranged on the basis of probabilities of symbol occurrences as defined in the pre-defined variable length code table.

14. The variable length decoding apparatus according to claim 13; wherein the predetermined sorting order includes assigning a symbol having the highest probability of occurrence the largest counter value.

15. The variable length decoding apparatus according to claim 11, wherein said control means comprises:

a controller for generating the load control signal based on a designated data structure, and for generating a code table information signal representing the pre-defined variable length code table;

a re-associator for producing counter values respectively corresponding to symbols in the pre-defined variable length code table, based on the probabilities of symbol occurrences as defined in the pre-defined variable length code table, and for generating the address-counter value assignment information representing a corresponding relationship between the counter values and the symbols; and a symbol identifier for generating the symbol-address assignment information based on the pre-defined variable length code table.

16. The variable length decoding apparatus according to claim 11, wherein said control means produces updated symbol-address assignment information and updated address-counter value assignment information predetermined refreshing data unit, based on the pre-defined variable length code table.

17. The variable length decoding apparatus according to claim 16, wherein the predetermined refreshing unit is slice unit as defined in data structure of the MPEG-2 standard.

18. The variable length decoding apparatus according to claim 16, wherein said control means calculates initial counter value C(M) corresponding to each symbol M belonging to said pre-defined variable length code table based on the following equation:

$$C(M) = \frac{\text{The average number of bits within a refreshing unit}}{\alpha \cdot 2^{(\text{a length of codeword corresponding to } i\text{-th symbol})}}$$

wherein α represents a sensitivity factor representing a response level of symbol-codeword re-association to a distribution of the variable-length-encoded symbols.

19. The variable length decoding apparatus according to claim 11, wherein said means is configured to sort counter values in a predetermined sorting order based on probabilities of symbol occurrences as defined in the pre-defined variable length code table whenever a symbol is input, and wherein said means is further arranged to vary the symbol-address assignment information according the sorted counter values, and to alter the address-counter value assignment information according to varied symbol-address assignment information.

20. The variable length decoding apparatus according to claim 11, wherein said control means comprises a symbol identifier for identifying a symbol which is input from the decoding means according to said address-symbol assignment information.

21. A method for variable-length-encoding an input signal received by a variable length encoding apparatus which receives symbols corresponding to the input signal, said method comprising the steps of:
producing symbol-address assignment information and address-counter value assignment information based on a pre-defined variable length code table stored in a control means;
outputting a load control signal at each predetermined updating data unit;
storing said symbol-address assignment information in synchronism with the load control signal;
outputting codewords respectively corresponding to received input symbols using said symbol-address assignment information to access a pre-defined variable length code table; and
varying the symbol-address assignment information and the address-counter value assignment information according to a received input symbol to produce a symbol-codeword re-associated variable length code table in which a symbol-codeword assignment in the pre-defined variable length code table is re-associated in accordance with results from varying the symbol-address assignment information and the address-counter value assignment information.

22. The method according to claim 21, wherein each said predetermined updating data unit comprises a macroblock as defined in a data structure of the MPEG-2 standard.

23. The method according to claim 22, further comprising the steps of:
updating the symbol-address assignment information and the address-counter value assignment information at each interval corresponding to a predetermined refreshing data unit, wherein the predetermined refreshing data unit is a slice unit as defined in data structure of the MPEG-2 standard.

24. The method according to claim 23, further comprising the step of:

calculating an initial counter value C(M) corresponding to each symbol M belonging to the pre-defined variable length code table based on the following equation:

$$C(M) = \frac{\text{The average number of bits within said predetermined refreshing data unit}}{\alpha \cdot 2^{(\text{a length of codeword corresponding to } i\text{-th symbol})}}$$

wherein α represents a sensitivity factor representing a response level of symbol-codeword re-association to a distribution of the variable length encoded symbols.

25. The method according to claim 22, wherein the varying step comprises the steps of:
sorting counter values in a predetermined sorting order based on probabilities of symbol occurrences as defined in the pre-defined variable length code table whenever a symbol is received by the variable length encoding apparatus; and
varying the symbol-address assignment information according to the sorted counter values to alter the address-counter value assignment information according to the varied symbol-address assignment information.

26. The method according to claim 21, wherein the producing step comprises the step of:
producing the symbol-address assignment information and the address-counter value assignment information using initial counter values sorted in a predetermined sorting order arranged in accordance with probabilities of symbol occurrences as defined in the pre-defined variable length code table.

27. The method according to claim 26, wherein said initial counter values are sorted by assigning a symbol having the highest probability of occurrence the largest counter value.

28. The method according to claim 21, further comprising the step of:
identifying a received symbol according to the said symbol-address assignment information.

29. A method for variable-length-decoding a codeword generated by a variable length encoding apparatus which re-associates a symbol-codeword relationship of a variable length code table whenever a symbol is variable-length-encoded, and replaces the variable length code table used for variable-length-encoding at every predetermined updating data unit by a symbol-codeword re-associated variable length code table, the method comprising the steps of:
producing symbol-address assignment information and address-counter value assignment information based on a pre-defined variable length code table;
outputting a load control signal at each predetermined interval;
storing the symbol-address assignment information in synchronism with the load control signal;
outputting symbols respectively corresponding to received input codewords using the symbol-address assignment information; and
varying the symbol-address assignment information and the address-counter value assignment information according to a symbol output during the outputting step to produce a symbol-codeword re-associated variable length code table in which a symbol-codeword assignment in the pre-defined variable length code table is re-associated in accordance with results from varying the symbol-address assignment information and the address-counter value assignment information.

30. The method according to claim 29, wherein the producing step comprises the step of:

producing the symbol-address assignment information and the address-counter value assignment information using initial counter values sorted in a predetermined sorting order based on probabilities of symbol occurrences as defined in the pre-defined variable length code table.

31. The method according to claim 29, wherein said producing step comprises the step of:

producing updated symbol-address assignment information and updated address-counter value assignment information after each predetermined refreshing data unit, which represents a slice unit as defined in data structure of the MPEG-2 standard.

32. The method according to claim 31, further comprising the step of:

calculating an initial counter value C(M) corresponding to each symbol M belonging to the pre-defined variable length code table based on the following equation:

$$C(M) = \frac{\text{The average number of bits within said predetermined refreshing data unit}}{\text{(a length of codeword corresponding to } i\text{-th symbol)}}$$

wherein $\alpha$ represents a sensitivity factor representing a response level of symbol-codeword re-association to a distribution of the variable length encoded symbols.

33. The method according to claim 29, wherein the varying step comprises the steps of:

sorting counter values in a predetermined sorting order based on probabilities of symbol occurrences as defined in the pre-defined variable length code table whenever a symbol is received; and varying the symbol-address assignment information according to the sorted counter values to alter the address-counter value assignment information according to the varied symbol-address assignment information.

34. The method according to claim 29, further comprising the step of:

identifying a received symbol according to the symbol-address assignment information.

\* \* \* \* \*